United States Patent
Hwang

(10) Patent No.: US 9,362,521 B2
(45) Date of Patent: Jun. 7, 2016

(54) ORGANIC LIGHT EMITTING DIODE DISPLAY

(71) Applicant: Samsung Display Co., Ltd., Yongin, Gyeonggi-Do (KR)

(72) Inventor: Jeong-Ho Hwang, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 125 days.

(21) Appl. No.: 14/060,819

(22) Filed: Oct. 23, 2013

(65) Prior Publication Data

US 2014/0159569 A1   Jun. 12, 2014

(30) Foreign Application Priority Data

Oct. 29, 2012   (KR) .......................... 10-2012-0120492

(51) Int. Cl.
*H01L 51/52* (2006.01)

(52) U.S. Cl.
CPC .................................. *H01L 51/5237* (2013.01)

(58) Field of Classification Search
CPC ..................................................... H01L 51/525
USPC ........................................................ 313/512
See application file for complete search history.

(56) References Cited

U.S. PATENT DOCUMENTS

| | | | | |
|---|---|---|---|---|
| 5,252,373 A | * | 10/1993 | Ganske | B32B 27/08 297/214 |
| 2005/0185110 A1 | * | 8/2005 | Lai et al. | 349/58 |
| 2006/0066772 A1 | * | 3/2006 | Takahashi et al. | 349/60 |
| 2006/0108050 A1 | * | 5/2006 | Satake et al. | 156/101 |
| 2009/0207560 A1 | * | 8/2009 | Lee | 361/679.01 |
| 2010/0073593 A1 | * | 3/2010 | Sasaki et al. | 349/58 |
| 2011/0241540 A1 | * | 10/2011 | Kim | 313/504 |
| 2011/0242743 A1 | * | 10/2011 | Moon | 361/679.01 |
| 2012/0056530 A1 | * | 3/2012 | Yee | 313/504 |
| 2012/0098426 A1 | * | 4/2012 | Lee et al. | 315/51 |
| 2012/0170244 A1 | * | 7/2012 | Kwon et al. | 361/829 |
| 2013/0135877 A1 | * | 5/2013 | Oh et al. | 362/362 |

FOREIGN PATENT DOCUMENTS

| | | |
|---|---|---|
| KR | 10-0918056 | 7/2009 |
| KR | 10-1127592 | 10/2011 |
| KR | 10-2012-0023897 | 3/2012 |

* cited by examiner

*Primary Examiner* — Nimeshkumar Patel
*Assistant Examiner* — Christopher Raabe
(74) *Attorney, Agent, or Firm* — Robert E. Bushnell, Esq.

(57) ABSTRACT

An organic light emitting diode (OLED) display that includes: a display panel that displays an image; a cover window that is positioned at the outside of a display surface of the display panel; a buffer member that is positioned at a rear surface of the display panel; and a set frame that encloses a rear surface and a side surface of the display panel at a predetermined distance from the buffer member. A distance between the buffer member and the set frame increases as receding from a central portion of the display panel.

15 Claims, 8 Drawing Sheets

ORGANIC LIGHT EMITTING DIODE DISPLAY

This application makes reference to, incorporates the same herein, and claims all benefits accruing under 35 U.S.C. §119 from an application earlier filed in the Korean Intellectual Property Office on 29 Oct. 2012 and there duly assigned Serial No 10-2012-0120492.

BACKGROUND OF THE INVENTION

1. Field of the Invention

The described technology relates generally to an organic light emitting diode (OLED) display.

2. Description of the Related Art

OLED displays have a self light emitting characteristic, do not require a separate light source, unlike liquid crystal displays (LCDs) and can thus reduce a thickness and a weight thereof. Further, the OLED display represents high quality characteristics of lower power consumption, high luminance, and a fast response speed.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an OLED display having advantages of suppressing damage of a display panel according to a drop impact by having a buffer function of the drop impact.

An exemplary embodiment provides an OLED display including: a display panel that displays an image; a cover window that may be positioned at the outside of a display surface of the display panel; a buffer member that may be positioned at a rear surface of the display panel; and a set frame that encloses the rear surface and a side surface of the display panel at a predetermined distance from the buffer member and that may be fixed to the cover window. A distance between the buffer member and the set frame increases as receding from a central portion of the display panel.

One surface of the buffer member toward the set frame may be formed as a convex curved surface toward the set frame. The one surface of the buffer member may be formed as a convex curved surface in a first direction parallel to one side of the display panel and a second direction orthogonal to the first direction. The set frame may include a bottom portion parallel to the display panel and a side wall that may be bent toward the cover window from the bottom portion to be opposite to the side surface of the display panel.

The buffer member may be formed in a constant thickness, and the set frame may have a buffer portion of a convex shape at the inside toward the buffer member. The set frame may include a bottom portion parallel to the display panel and a side wall that may be bent toward the cover window from the bottom portion to be opposite to the side surface of the display panel, and the buffer portion may be fixed to an inner surface of the bottom portion.

The one surface of the buffer member may be formed as a convex curved surface in a first direction parallel to one side of the display panel and a second direction orthogonal to the first direction. The bottom portion and the side wall may be formed with any one of magnesium, magnesium alloy, aluminum, aluminum alloy, and stainless steel. The buffer portion may be formed with a sponge or a polymer resin that may be formed by foaming shaping any one of a rubber liquid, a urethane-based material, and an acryl-based material.

The display panel may include a first substrate that has a display area and a pad area; a second substrate that may be attached to the first substrate to cover the display area; and a sealant that may be formed along an edge of the second substrate at one surface of the second substrate toward the first substrate. The cover window may be positioned at the outside of the second substrate, and the buffer member may be positioned at the outside of the first substrate.

The OLED display may further include: an adhesive layer that may be positioned between the cover window and the second substrate; and a support member that receives and supports the display panel between the display panel and the buffer member. A gasket cushion adhesive may be positioned between the set frame and the cover window.

When a drop impact is applied to the OLED display, by reducing first impact energy that is transferred to the display panel and by reducing impact energy that is propagated from a first point of the display panel toward a completion point, intensity of a shock wave arriving at the completion point can be reduced. Therefore, by lowering a maximum impact amount of a display panel according to a drop impact, a damage failure of the display panel can be suppressed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
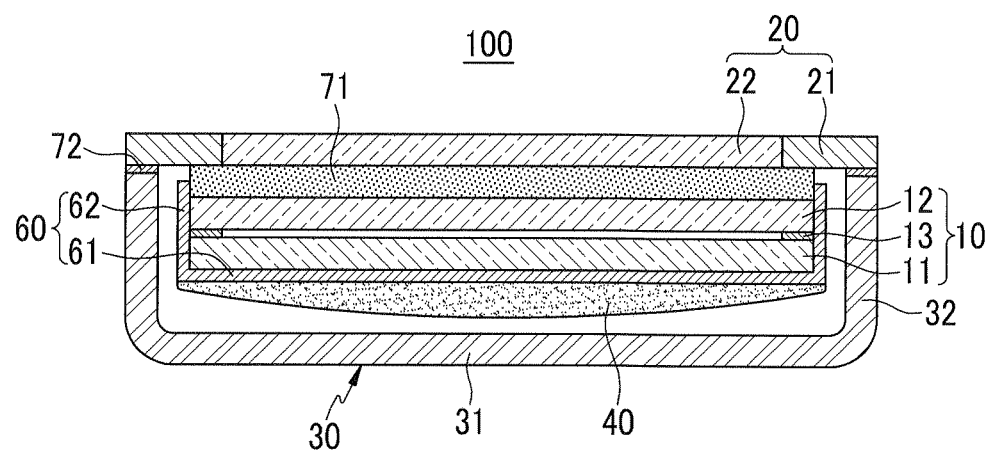
FIG. 1 is a cross-sectional view illustrating an OLED display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, in the specification, unless explicitly described to the contrary, the word "comprise" and variations such as "comprises" or "comprising," will be understood to imply the inclusion of stated elements but not the exclusion of any other elements. When it is said that any part, such as a layer, film, region, or plate, is positioned on another part, it means the part is directly on the other part or above the other part with at least one intermediate part. Further, in the specification, it means that an upper part of a target portion indicates an upper part or a lower part of a target portion, and it does not mean that the target portion is always positioned at the upper side based on a gravity direction.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An OLED display may include a display panel and a cover window (or a transparent protection portion) and a set frame that enclose and protect the display panel. The display panel includes a plurality of pixels, displays an image, and is connected to a flexible printed circuit (FPC) through a circuit film to receive a control signal necessary for driving the pixel. The cover window is positioned at the outside of a front surface (a display surface) of the display panel, and the set frame encloses a side surface and a rear surface of the display panel.

The display panel may be formed with two thin substrates and has a structure in which empty space exists between two substrates, unlike a liquid crystal display panel whose inside is filled with liquid crystal and thus is weak on an outside impact. Therefore, when a drop impact is applied to the OLED display, while the set frame is being bent, impact energy is applied to the display panel, and a failure in which the display panel is damaged by impact energy may occur.

Figure 2:
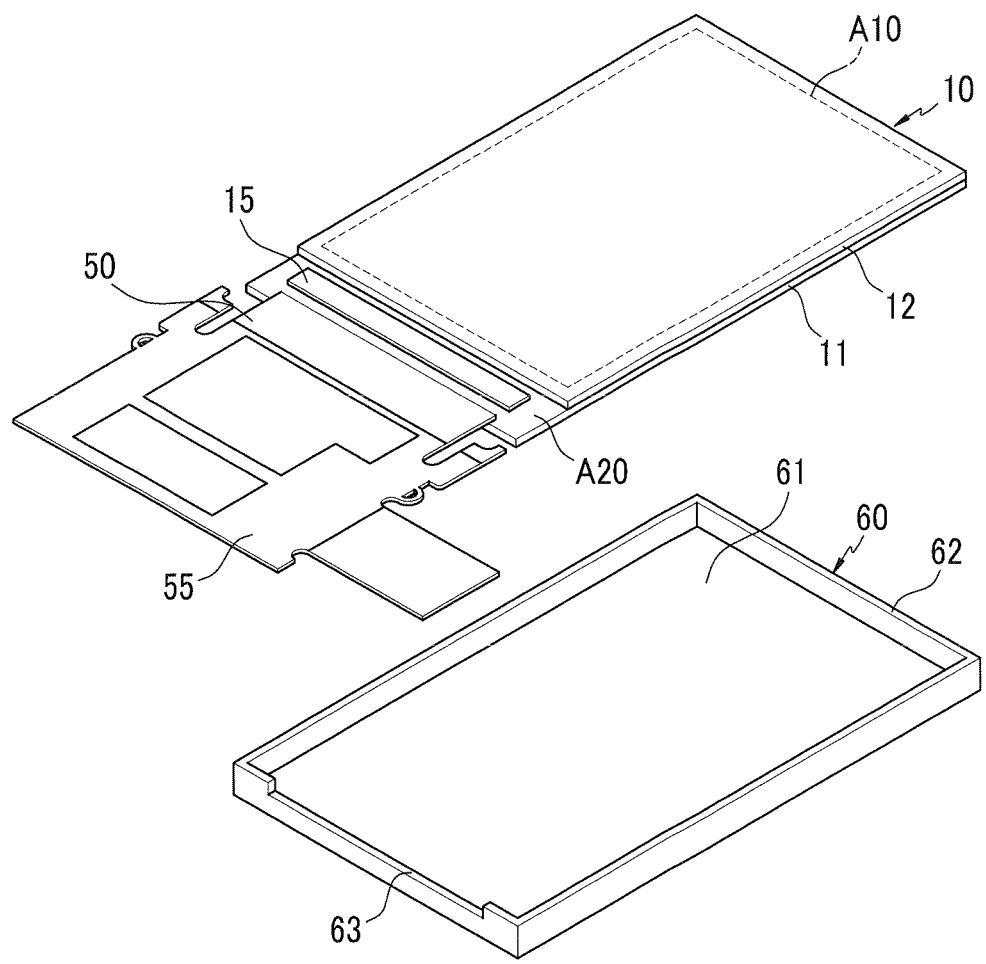
FIG. 2 is an exploded perspective view illustrating a display panel and a support member that are shown in FIG. 1.

FIG. 1 is a cross-sectional view illustrating an OLED display according to a first exemplary embodiment. FIG. 2 is an exploded perspective view illustrating a display panel and a support member that are shown in FIG. 1, and FIG. 3 is a perspective view illustrating a coupling state of the display panel and the support member that are shown in FIG. 2.

Figure 3:
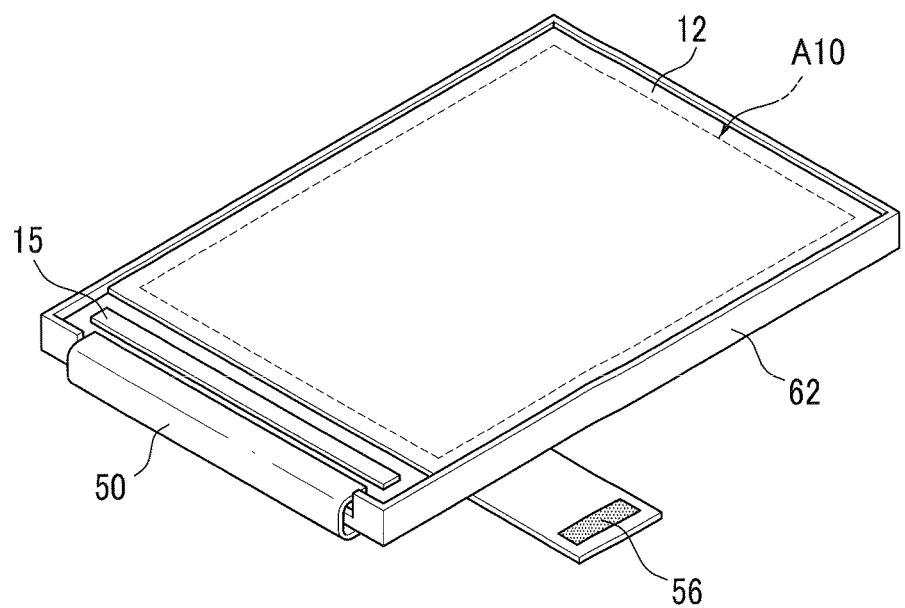
FIG. 3 is a perspective view illustrating a coupling state of the display panel and the support member that are shown in FIG. 2.

Referring to FIGS. 1 to 3, an OLED display 100 of the first exemplary embodiment includes a display panel 10 that displays an image, a cover window 20 that may be coupled to the display panel 10, a set frame 30, and a buffer member 40. Further, the OLED display 100 includes a circuit film 50 and a FPC 55 that are connected to the display panel 10.

The display panel 10 includes a first substrate 11 having a display area A10 and a pad area A20 and a second substrate 12 that may be bonded on the first substrate 11. A plurality of signal lines (including scan lines and data lines) and a plurality of pixels are positioned at the display area A10 of the first substrate 11, and a plurality of pad electrodes (not shown) are positioned at the pad area A20.

An integrated circuit chip 15 may be positioned at the pad area A20 of the first substrate 11, and a scan driver (not shown) and a data driver (not shown) are positioned at the outside of the display area A10. The scan driver supplies a scan signal to a plurality of pixels through the scan lines, and the data driver supplies a data signal to a plurality of pixels through data lines.

The second substrate 12 may be formed in a size smaller than that of the first substrate 11 and may be attached to the display area A10 of the first substrate 11. The first substrate 11 and the second substrate 12 are integrally bonded by a sealant 13 that may be applied along an edge of the second substrate 12. The second substrate 12 may be an encapsulation substrate and seals a plurality of pixels together with the sealant 13, thereby protecting the plurality of pixels from an external environment including moisture and oxygen. The first substrate 11 and the second substrate 12 are formed as an insulation substrate such as glass or plastic.

The FPC 55 includes electronic elements (not shown) for processing a driving signal and a connector 56 for receiving an external signal. The circuit film 50 electrically and physically connects the display panel 10 and the FPC 55. An end portion of one side of the circuit film 50 may be fixed to the pad area A20 to be electrically connected to pad electrodes, and an end portion of the opposite side thereof may be fixed to the FPC 55 to be electrically connected to wires of the FPC 55.

A driving signal that may be generated in the FPC 55 is transferred to the display panel 10 through the circuit film 50, and the display panel 10 displays an image using light that may be generated in a plurality of pixels. Light that is generated at the plurality of pixels transmits the second substrate 12 and is emitted to the outside. In this case, a display surface of the display panel 10 becomes an outer surface of the second substrate 12.

A support member 60 that receives and supports the display panel 10 may be provided at the opposite side of the display surface of the display panel 10. The support member 60 may be formed with a bottom portion 61 parallel to the first substrate 11 and a side wall 62 contacting with an edge of the bottom portion 61. The first substrate 11 of the display panel 10 contacts with the bottom portion 61 and may be disposed on the bottom portion 61, and the side wall 62 encloses a side surface of the display panel 10. The support member 60 may be made of a metal such as stainless steel, aluminum, aluminum alloy, and nickel alloy.

An opening 63 may be formed in a portion of the side wall 62 corresponding to the circuit film 50 and enables the circuit film 50 to be drawn out to the outside of the support member 60. The circuit film 50 may be bent toward a rear surface of the support member 60, and the FPC 55 may be positioned at the outside of the bottom portion 61 not to cover the display surface. When the support member 60 may be omitted, the FPC 55 may be positioned at the outside of the first substrate 11.

The cover window 20 may be positioned at the outside of a display surface of the display panel 10 and protects the display surface from an external impact and scratch that are applied from the outside of the display surface. Specifically, the cover window 20 may be positioned at the outside of the second substrate 12 and covers all of the second substrate 12 and the pad area A20. The cover window 20 may be made of a transparent material such as glass or transparent plastic.

The cover window 20 includes a light blocking portion 21 corresponding to an edge of the display panel 10 including the pad area A20 and a light emitting portion 22 corresponding to the display area A10. The light blocking portion 21 performs a function of blocking unnecessary light and covering a portion in which an image is not displayed in the display panel 10. The cover window 20 may be entirely transparently formed without forming the light blocking portion 21.

An adhesive layer 71 may be positioned between the display panel 10 and the cover window 20 and mutually bonds the display panel 10 and the cover window 20. The adhesive layer 71 fills space between the second substrate 12 and the cover window 20 and may be formed in the same area as that of the second substrate 12. The adhesive layer 71 includes an acryl-based resin that is cured by ultraviolet rays or a heat. A polarizing plate (not shown) for suppressing external light reflection between the second substrate 12 and the adhesive layer 71 is provided.

The set frame 30 encloses a side surface and a rear surface of the display panel 10 and may be fixed to the cover window 20 to form an external form of the OLED display 100 together with the cover window 20. The set frame 30 may be formed with a bottom portion 31 parallel to the first substrate 11 and a side wall 32 that may be bent from the bottom portion 31 toward the cover window 20 to be opposite to a side surface of the display panel 10.

The set frame 30 may be formed with a metal having high rigidity, for example, magnesium, magnesium alloy, aluminum, aluminum alloy, and stainless steel and has a thickness larger than that of the support member 60. The set frame 30 and the cover window 20 are bonded to each other by an adhesion member 72. In this case, as a gasket cushion adhesive may be used as the adhesion member 72, the adhesion member 72 performs a predetermined buffering operation.

The buffer member 40 may be positioned between the display panel 10 and the set frame 30 and performs a function of reducing impact energy that is transferred from the set frame 30 to the display panel 10. When the OLED display 100 includes the support member 60, the buffer member 40 may be positioned at a rear surface of the bottom portion 61 of the support member 60, and when the support member 60 is omitted, the buffer member 40 may be positioned at a rear surface of the first substrate 11. FIG. 1 illustrates a first case.

The buffer member 40 may be formed with a sponge that may be formed by foaming shaping a rubber liquid, a urethane-based material, or an acryl-based material. The buffer member 40 may be formed in the same size as that of the bottom portion 61 of the support member 60 or the first substrate 11, has an adhesive layer (not shown) at one surface toward the first substrate 11, and may be attached to a rear surface of the bottom portion 61 of the support member 60 or a rear surface of the first substrate 11.

The buffer member 40 may be positioned at a predetermined distance without contacting with the set frame 30. That is, the display panel 10 and the buffer member 40 sustain a loose state based on the set frame 30. Space between the buffer member 40 and the set frame 30 functions as buffer space that delays impact transfer.

A distance between the buffer member 40 and the set frame 30 increases as receding from a central portion of the display panel 10. That is, a distance between the buffer member 40 and the set frame 30 may be a minimum at a central portion of the display panel 10 and may be a maximum at the edge of the display panel 10. For this purpose, the buffer member 40 may be formed in a changing thickness instead of being formed in a constant thickness. Specifically, one surface (a rear surface) of the buffer member 40 toward the set frame 30 may be formed in a convex curved surface toward the set frame 30.

Figure 4:
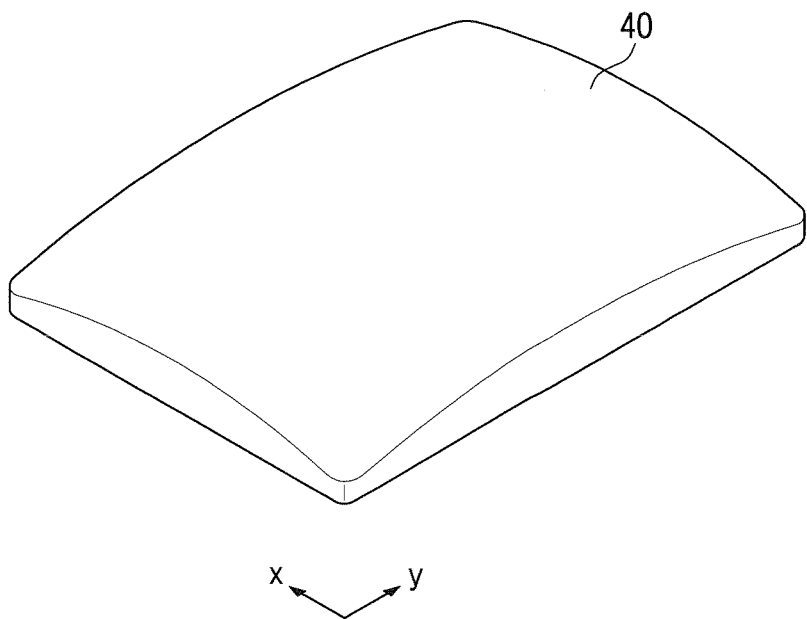
FIG. 4 is a perspective view illustrating a buffer member that is shown in FIG. 1.

FIG. 4 is a perspective view illustrating a buffer member that is shown in FIG. 1, and a rear surface of a buffer member toward a set frame faces upward.

Referring to FIGS. 1 and 4, the rear surface of the buffer member 40 may be formed in a convex curved surface in a first direction (x-axis direction) parallel to one side of the display panel 10 and may be formed in a convex curved surface in a second direction (y-axis direction) orthogonal to the first direction. Therefore, the buffer member 40 may be formed in a largest thickness at a central portion, may be formed in a smallest thickness at an edge, and has a gradually reducing thickness from the central portion toward the edge.

As a drop impact is applied to one point (one point on a circumferential edge) of the display panel 10, when impact energy is propagated toward another one point (one point on an opposite circumferential edge) of the display panel 10, a gap change between the buffer member 40 and the set frame 30 performs a function of reducing a deformation amount of the display panel 10 by distributing impact energy.

Figure 5:
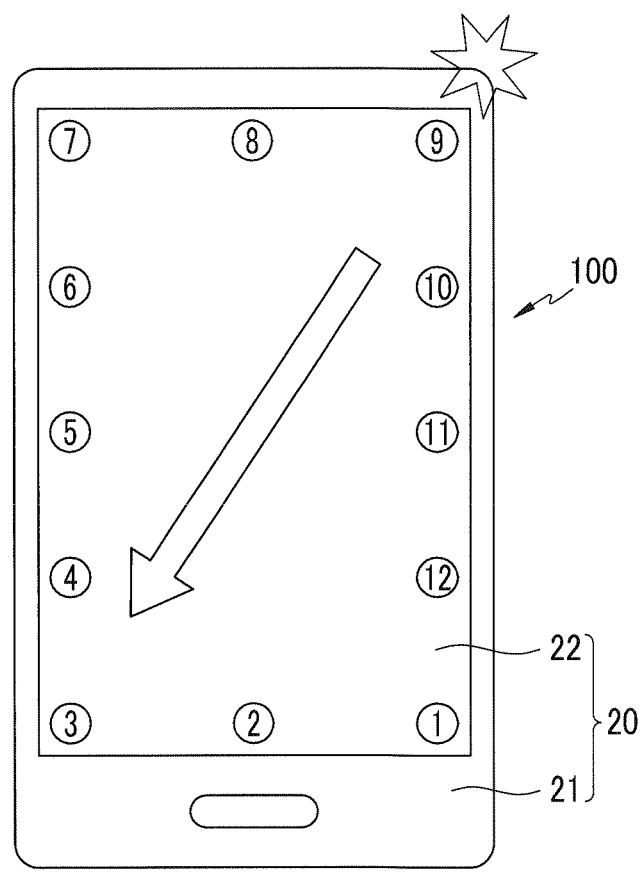
FIG. 5 is a top plan view illustrating the OLED display that is shown in FIG. 1.

FIG. 5 is a top plan view illustrating the OLED display that is shown in FIG. 1.

Referring to FIGS. 1 and 5, when a drop impact is applied to the OLED display 100, the set frame 30 that first arrives at the ground is deformed while being bent, deformation energy applies a pressure to the display panel 10, and impact energy is transferred to the display panel 10. A point at which an impact is first applied to the display panel 10 is one point on a circumferential edge, and FIG. 5 illustrates a case where a first impact is applied at a point ⑨.

Impact energy that is applied to the display panel 10 is propagated from a first point toward one point on an opposite circumferential edge. In FIG. 5, impact energy that is applied to the first point ⑨ is propagated to a point ③ that may be positioned at the side opposite to the point ⑨ in an arrow direction.

Because the display panel 10 has a structure in which the first substrate 11 and the second substrate 12 of a small thickness are attached by the sealant 13 only at the edge, impact energy is easily propagated in an arrow direction. Further, a deformation amount of the display panel 10 by impact energy becomes a maximum at a completion point (the point ③ in FIG. 5) at which impact energy finally arrives.

In this case, as a rear surface of the buffer member 40 may be convexly formed, the gap difference occurs, and thus impact energy is distributed from a main direction (an arrow direction of FIG. 5) advancing from a first point toward a completion point to other directions. Further, because the buffer member 40 may be formed in a largest thickness in a central portion, the buffer member 40 delays propagation of impact energy passing through the central portion. As a result, intensity of a shock wave arriving at a completion point of the display panel 10 decreases.

Further, because the set frame 30 sustains a largest distance from the buffer member 40 at the edge of the display panel 10, when the set frame 30 may be deformed while being bent by a drop impact, space between the buffer member 40 and the set frame 30 reduces first impact energy that is transferred to the display panel 10.

In this way, the OLED display 100 of the present exemplary embodiment reduces first impact energy that is transferred to the display panel 10 and reduces impact energy that is propagated from a first point of the display panel 10 toward a completion point, thereby reducing intensity of a shock wave arriving at the completion point. Therefore, by lowering a maximum impact amount of the display panel 10 according to a drop impact, a damage failure of the display panel 10 can be suppressed.

Figure 6:
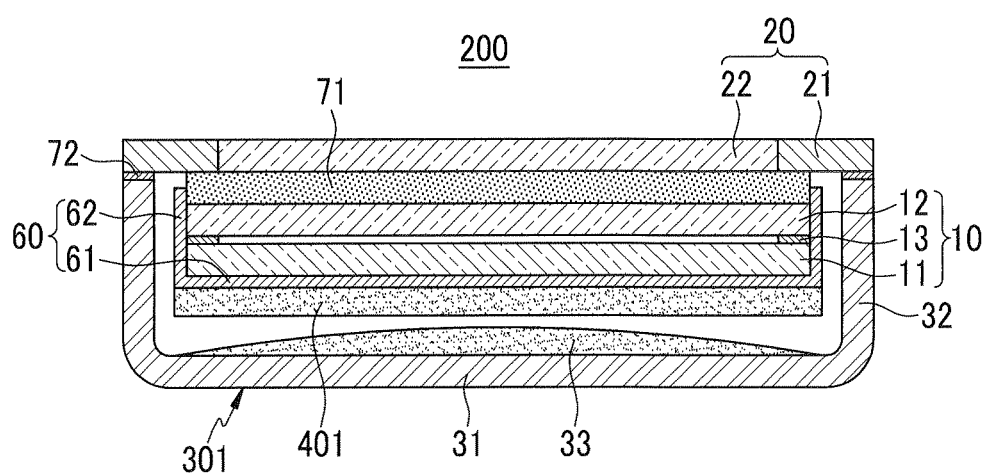
FIG. 6 is a cross-sectional view illustrating an OLED display according to a second exemplary embodiment.
Figure 7:
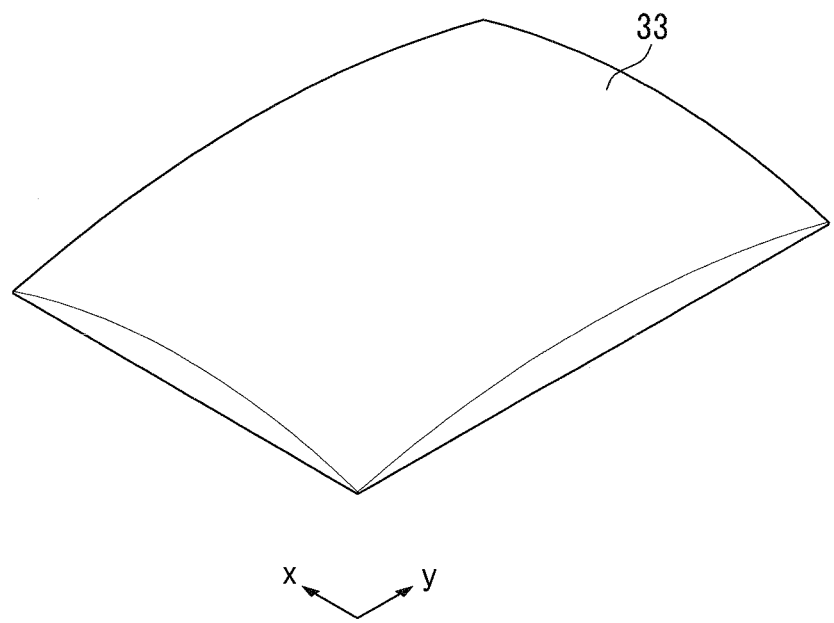
FIG. 7 is a perspective view illustrating a second buffer member that is shown in FIG. 6.

FIG. 6 is a cross-sectional view illustrating an OLED display according to a second exemplary embodiment, and FIG. 7 is a perspective view illustrating a second buffer member that is shown in FIG. 6.

Referring to FIGS. 6 and 7, an OLED display 200 of the second exemplary embodiment has the same configuration as that of the OLED display of the first exemplary embodiment, except that a buffer member 401 may be formed in a constant thickness and that a set frame 301 additionally forms a buffer portion 33 of a convex shape at the inside toward the buffer member 401. Constituent elements identical to or corresponding to those of the first exemplary embodiment are denoted by the same reference numerals, and constituent elements different from those of the first exemplary embodiment will be described here in detail.

In the second exemplary embodiment, the buffer member 401 may be formed in a constant thickness and the buffer portion 33 may be positioned at the inside of the set frame 301 toward a display panel 10. That is, the set frame 301 includes a bottom portion 31 parallel to a first substrate 11, a side wall 32 that are bent toward a cover window 20 from the bottom portion 31 to be opposite to a side surface of the first substrate 11 and a second substrate 12, and the buffer portion 33 that may be fixed to one surface of the bottom portion 31 toward the buffer member 401.

The bottom portion 31 and the side wall 32 of the set frame 301 may be made of a metal, for example, magnesium, magnesium alloy, aluminum, aluminum alloy, and stainless steel.

The buffer portion 33 may be made of a polymer resin, or a sponge that may be formed by foaming shaping a rubber liquid, a urethane-based material, or an acryl-based material.

One surface of the buffer portion 33 toward the display panel 10 may be formed in a convex curved surface in a first direction (x-axis direction) parallel to one side of the display panel 10 and may be formed in a convex curved surface in a second direction (y-axis direction) orthogonal to the first direction. Thereby, the buffer portion 33 may be formed in a largest thickness at a central portion, may be formed in a smallest thickness at an edge, and has a gradually reducing thickness from the central portion toward the edge.

The buffer member 401 may be positioned at a predetermined distance without contacting with the set frame 301. That is, as in the first exemplary embodiment, the display panel 10 and the buffer member 401 sustain a loose state based on the set frame 301.

By a shape of the buffer portion 33, a distance between the buffer member 401 and the set frame 301 increases as receding from a central portion of the display panel 10. That is, the distance between the buffer member 401 and the set frame 301 may be a minimum at the central portion of the display panel 10 and may be a maximum at the edge of the display panel 10.

When a drop impact is applied to the OLED display 200, the set frame 301 that first arrives at the ground is deformed while being bent, and deformation energy applies a pressure to the display panel 10, and impact energy is thus transferred to the display panel 10. A point at which an impact is first applied to the display panel 10 is one point on a circumferential edge, and impact energy is propagated toward one point on an opposite circumferential edge (see FIG. 5).

Impact energy is distributed from a main direction (an arrow direction of FIG. 5) advancing toward a completion point from a first point to other directions according to a gap change between the buffer member 401 and the set frame 301. Further, when the set frame 301 is deformed while being bent by a drop impact, space between the buffer member 401 and the set frame 301 corresponding to the edge of the display panel 10 reduces first impact energy that is transferred to the display panel 10.

Therefore, the OLED display 200 of the second exemplary embodiment reduces intensity of a shock wave arriving at a completion point of the display panel 10, as in the OLED display of the first exemplary embodiment and lowers a maximum impact amount of the display panel 10, thereby suppressing a damage failure of the display panel 10.

Figure 8:
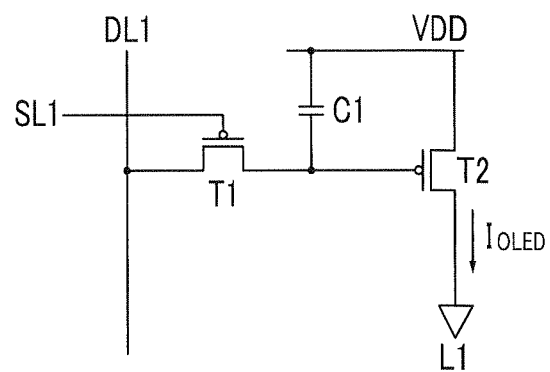
FIG. 8 is a layout view illustrating a pixel circuit of a display panel that is shown in FIG. 1.
Figure 9:
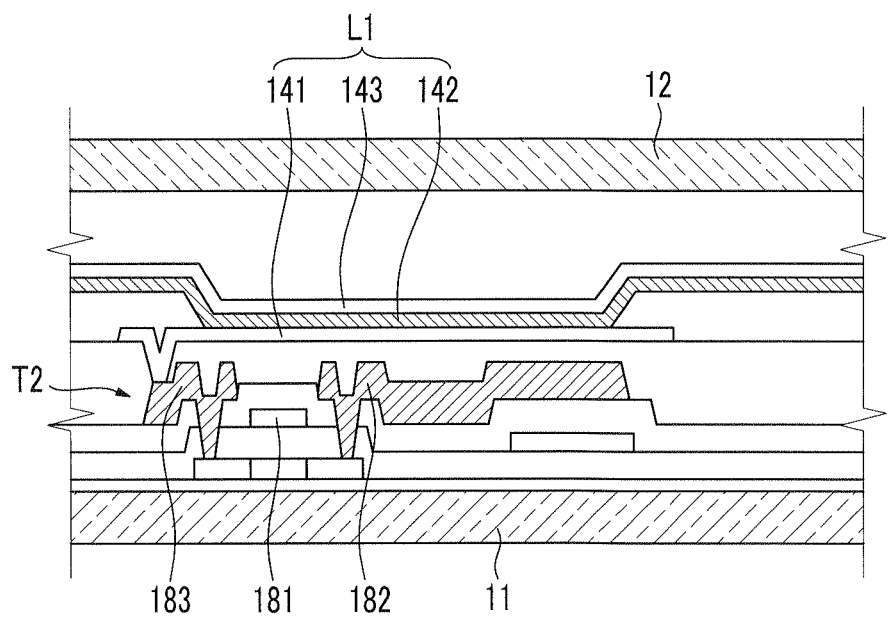
FIG. 9 is a partially enlarged cross-sectional view illustrating a display panel that is shown in FIG. 1.

FIG. 8 is a layout view illustrating a pixel circuit of a display panel that is shown in FIG. 1, and FIG. 9 is a partially enlarged cross-sectional view illustrating a display panel that is shown in FIG. 1.

Referring to FIGS. 8 and 9, a pixel includes an OLED L1 and driving circuit portions T1, T2, and C1. The OLED L1 includes a pixel electrode 141, an organic emission layer 142, and a common electrode 143. The driving circuit portions T1, T2, and C1 include at least two thin film transistors (a switching transistor T1 and a driving transistor T2) and at least one capacitor C1.

The switching transistor T1 may be connected to a scan line SL1 and a data line DL1 and transmits a data voltage that may be input at the data line DL1 to the driving transistor T2 according to a switching voltage that may be input to the scan line SL1. The capacitor C1 may be connected to the switching transistor T1 and a power source line VDD and stores a voltage corresponding to a difference between a voltage that receives from the switching transistor T1 and a voltage that may be supplied to the power source line VDD.

The driving transistor T2 may be connected to the power source line VDD and the capacitor C1 to supply an output current $I_{OLED}$ proportional to the square of a difference between a voltage that may be stored at the capacitor C1 and a threshold voltage to the OLED L1, and the OLED L1 emits light with intensity proportional to the output current $I_{OLED}$. The driving transistor T2 includes a gate electrode 181 and a source electrode 182 and a drain electrode 183, and the pixel electrode 141 may be connected to the drain electrode 183 of the driving transistor T2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
    a display panel that displays an image;
    a cover window that is positioned at the outside of a display surface of the display panel;
    a buffer member that is positioned at a rear surface of the display panel; and
    a set frame that encloses the rear surface and a side surface of the display panel at a predetermined distance from the buffer member and that is fixed to the cover window,
    wherein one surface of the buffer member that faces the set frame has a convex curved surface shape, said one surface is without angles and is neither a straight line nor a flat plane, and
    wherein said one surface is a continuously bending line or plane in which a distance between the one surface of the buffer member and the set frame increases from a midpoint portion of the one surface as the one surface recedes from a central portion of the display panel.

2. The OLED display of claim 1, wherein the one surface of the buffer member is formed as a convex curved surface in a first direction parallel to one side of the display panel and a second direction orthogonal to the first direction.

3. The OLED display of claim 1, wherein the set frame comprises a bottom portion parallel to the display panel and a side wall that is bent toward the cover window from the bottom portion to be opposite to the side surface of the display panel.

4. The OLED display of claim 1, wherein the buffer member is formed in a constant thickness, and
    the set frame has a buffer portion of a convex shape at the inside toward the buffer member.

5. The OLED display of claim 4, wherein the set frame comprises a bottom portion parallel to the display panel and a side wall that is bent toward the cover window from the bottom portion to be opposite to the side surface of the display panel, and
    the buffer portion is fixed to an inner surface of the bottom portion.

6. The OLED display of claim 5, wherein the one surface of the buffer member is formed as a convex curved surface in a first direction parallel to one side of the display panel and a second direction orthogonal to the first direction.

7. The OLED display of claim 5, wherein the bottom portion and the side wall are formed with any one of magnesium, magnesium alloy, aluminum, aluminum alloy, and stainless steel, and
    the buffer portion is formed with a sponge or a polymer resin that is formed by foaming shaping any one of a rubber liquid, an urethane-based material, and an acryl-based material.

8. The OLED display of claim 1, wherein the display panel comprises
    a first substrate that has a display area and a pad area;
    a second substrate that is attached to the first substrate to cover the display area; and
    a sealant that is formed along an edge of the second substrate at one surface of the second substrate toward the first substrate.

9. The OLED display of claim 8, wherein the cover window is positioned at the outside of the second substrate, and
    the buffer member is positioned at the outside of the first substrate.

10. The OLED display of claim 9, further comprising:
    an adhesive layer that is positioned between the cover window and the second substrate; and
    a support member that receives and supports the display panel between the display panel and the buffer member.

11. The OLED display of claim 1, wherein a gasket cushion adhesive is positioned between the set frame and the cover window.

12. The OLED display of claim 1, wherein a major surface of the convex curved surface is convex curved in two orthogonal directions.

13. The OLED display of claim 1, wherein the major surface of the buffer member facing toward the set frame is entirely convex curved and facing toward the set frame.

14. The OLED display of claim 12, wherein the set frame comprises a bottom portion parallel to the display panel and a side wall that is bent toward the cover window from the bottom portion to be opposite to the side surface of the display panel.

15. An organic light emitting diode (OLED) display, comprising:
    a display panel displaying an image;
    a cover window positioned at the outside of a display surface of the display panel;
    a buffer member positioned in proximity to a rear surface of the display panel; and
    a set frame fixed to the cover window and enclosing the rear surface and a side surface of the display panel,
    wherein the buffer member and the set frame are isolated from each other by a distance of separation between the set frame and one surface of the buffer member opposite to the rear surface of the display panel, the distance of separation increasing as the one surface recedes from a central portion of the display panel.

* * * * *